US008919075B2

(12) United States Patent
Erickson

(10) Patent No.: US 8,919,075 B2
(45) Date of Patent: Dec. 30, 2014

(54) UNITIZED PHOTOVOLTAIC ASSEMBLY

(71) Applicant: Richard William Erickson, Pomona, CA (US)

(72) Inventor: Richard William Erickson, Pomona, CA (US)

(*) Notice: Subject to any disclaimer, the term of this patent is extended or adjusted under 35 U.S.C. 154(b) by 0 days.

(21) Appl. No.: 14/080,383

(22) Filed: Nov. 14, 2013

(65) Prior Publication Data
US 2014/0150251 A1 Jun. 5, 2014

Related U.S. Application Data

(63) Continuation of application No. 13/065,104, filed on Mar. 15, 2011.

(51) Int. Cl.
E04B 1/35 (2006.01)
H01L 31/18 (2006.01)
H01L 31/048 (2014.01)
H01L 31/05 (2014.01)
F24J 2/46 (2006.01)
F24J 2/52 (2006.01)
H01L 31/042 (2014.01)

(52) U.S. Cl.
CPC ............ H01L 31/18 (2013.01); H01L 31/0482 (2013.01); H01L 31/05 (2013.01); F24J 2/461 (2013.01); F24J 2/5205 (2013.01); F24J 2/5245 (2013.01); F24J 2/5254 (2013.01); F24J 2/526 (2013.01); H01L 31/0428 (2013.01); Y02E 10/50 (2013.01); Y02B 10/12 (2013.01); F24J 2002/5218 (2013.01); F24J 2002/5284 (2013.01); Y02B 10/20 (2013.01); Y02E 10/47 (2013.01)
USPC ........................................ 52/745.2; 52/173.3

(58) Field of Classification Search
USPC ................................. 52/745.19, 745.2, 173.3
See application file for complete search history.

(56) References Cited

U.S. PATENT DOCUMENTS

| 4,150,660 | A | 4/1979 | Peters et al. |
| 4,154,223 | A | 5/1979 | Lof |
| 4,372,292 | A | 2/1983 | Ort |
| 4,429,872 | A | 2/1984 | Capachi |
| 4,636,577 | A | 1/1987 | Peterpaul |
| 4,936,063 | A | 6/1990 | Humphrey |
| 5,338,369 | A | 8/1994 | Rawlings |
| 5,409,549 | A | 4/1995 | Mori |
| 5,497,587 | A | 3/1996 | Hirai et al. |
| 5,524,401 | A | 6/1996 | Ishikawa et al. |
| 5,706,617 | A | 1/1998 | Hirai et al. |
| 5,740,996 | A | 4/1998 | Genschorek |
| 5,787,653 | A | 8/1998 | Sakai et al. |
| 5,986,203 | A | 11/1999 | Hanoka et al. |

(Continued)

Primary Examiner — Andrew J Triggs
(74) Attorney, Agent, or Firm — Klein, O'Neill & Singh, LLP

(57) ABSTRACT

A unitized photovoltaic assembly is disclosed. A unitized photovoltaic assembly consists of a unitary frame designed to retain a plurality of photovoltaic modules. The unitary frame is formed by orienting a plurality of rails in the lateral direction above and mounted to a plurality of struts oriented in the vertical direction. Once the unitary framed is formed, photovoltaic modules slide into slots running the length of the rails and are thus retained in the unitary frame. Also added to the unitary frame are a series of power conversion elements, retaining brackets, mounting brackets, and cleaning elements. The completed unitized photovoltaic assembly can be fabricated off-site, transported as a single unit and installed to a roof or other surface with the use of a specialized lifting frame, also disclosed. Additional unitized photovoltaic assemblies can be mechanically and electrically interconnected to form a complete photovoltaic system.

16 Claims, 11 Drawing Sheets

(56) References Cited

U.S. PATENT DOCUMENTS

| | | | |
|---|---|---|---|
| 6,105,317 A | 8/2000 | Tomiuchi et al. | |
| 6,201,179 B1 | 3/2001 | Dalacu | |
| 6,201,180 B1 | 3/2001 | Meyer et al. | |
| 6,323,478 B1 | 11/2001 | Fujisaki et al. | |
| 6,360,491 B1 | 3/2002 | Ullman | |
| 6,414,237 B1 | 7/2002 | Boer | |
| 6,521,821 B2 | 2/2003 | Makita et al. | |
| 6,670,541 B2 | 12/2003 | Nagao et al. | |
| 6,672,018 B2 * | 1/2004 | Shingleton | 52/173.3 |
| 6,784,360 B2 | 8/2004 | Nakajima et al. | |
| 6,959,517 B2 | 11/2005 | Poddany et al. | |
| 7,012,188 B2 | 3/2006 | Erling | |
| 7,043,884 B2 | 5/2006 | Moreno | |
| 7,260,918 B2 | 8/2007 | Liebendorfer | |
| 7,406,800 B2 | 8/2008 | Cinnamon et al. | |
| 7,487,771 B1 | 2/2009 | Eiffert et al. | |
| 7,592,537 B1 | 9/2009 | West | |
| 7,721,492 B2 | 5/2010 | Plaisted et al. | |
| 7,745,722 B2 | 6/2010 | Warfield et al. | |
| 7,748,175 B2 | 7/2010 | Liebendorfer | |
| 7,766,292 B2 | 8/2010 | Liebendorfer | |
| 7,774,998 B2 | 8/2010 | Aschenbrenner | |
| 7,819,114 B2 | 10/2010 | Augenbraun et al. | |
| 7,832,157 B2 | 11/2010 | Cinnamon | |
| 7,832,176 B2 | 11/2010 | McCaskill et al. | |
| 7,847,185 B2 | 12/2010 | Schwarze | |
| 7,900,407 B2 * | 3/2011 | Plaisted | 52/173.3 |
| 7,915,519 B2 | 3/2011 | Kobayashi | |
| 8,176,693 B2 | 5/2012 | Abbott et al. | |
| 8,256,169 B2 | 9/2012 | Cusson et al. | |
| 8,273,981 B2 | 9/2012 | Kobayashi | |
| 8,316,590 B2 | 11/2012 | Cusson | |
| 8,404,963 B2 | 3/2013 | Kobayashi | |
| 8,461,449 B2 | 6/2013 | Kobayashi | |
| 2003/0094193 A1 | 5/2003 | Mapes et al. | |
| 2004/0163338 A1 | 8/2004 | Liebendorfer | |
| 2006/0086382 A1 | 4/2006 | Plaisted | |
| 2006/0118163 A1 | 6/2006 | Plaisted et al. | |
| 2006/0225780 A1 | 10/2006 | Johnson, III et al. | |
| 2006/0260670 A1 | 11/2006 | Terunuma et al. | |
| 2007/0079861 A1 | 4/2007 | Morali | |
| 2007/0079865 A1 | 4/2007 | Warfield et al. | |
| 2007/0251567 A1 * | 11/2007 | Plaisted | 136/244 |
| 2008/0053517 A1 | 3/2008 | Plaisted et al. | |
| 2008/0087320 A1 | 4/2008 | Mapes et al. | |
| 2009/0014058 A1 | 1/2009 | Croft et al. | |
| 2009/0019796 A1 | 1/2009 | Liebendorfer | |
| 2009/0078299 A1 | 3/2009 | Cinnamon et al. | |
| 2009/0114270 A1 * | 5/2009 | Stancel | 136/251 |
| 2009/0114271 A1 * | 5/2009 | Stancel | 136/251 |
| 2009/0230265 A1 * | 9/2009 | Newman et al. | 248/229.11 |
| 2009/0282755 A1 * | 11/2009 | Abbott et al. | 52/173.3 |
| 2010/0018571 A1 * | 1/2010 | Placer | 136/251 |
| 2010/0065108 A1 | 3/2010 | West et al. | |
| 2010/0147362 A1 | 6/2010 | King et al. | |
| 2010/0237028 A1 | 9/2010 | Cusson | |
| 2010/0288336 A1 | 11/2010 | Kitano et al. | |
| 2010/0294340 A1 | 11/2010 | Cunningham et al. | |
| 2012/0017526 A1 | 1/2012 | Eide | |
| 2012/0023726 A1 * | 2/2012 | Bellacicco et al. | 29/428 |
| 2012/0111393 A1 * | 5/2012 | Conley et al. | 136/251 |
| 2012/0233940 A1 * | 9/2012 | Perkins et al. | 52/173.3 |
| 2012/0234377 A1 * | 9/2012 | Erickson | 136/251 |
| 2012/0240485 A1 | 9/2012 | Amarasinghe | |
| 2014/0150251 A1 * | 6/2014 | Erickson | 29/825 |

* cited by examiner

UNITIZED PHOTOVOLTAIC ASSEMBLY

CROSS-REFERENCE TO RELATED APPLICATION

The present application is a continuation of U.S. patent application Ser. No. 13/065,104, filed Mar. 15, 2011, the entirety of which is incorporated by reference.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

1. Field of the Invention

The present invention is in the field of photovoltaic panels. More particularly, the present invention is in the technical field of photovoltaic panel mounting systems.

2. Description of the Related Art

Photovoltaic, or solar, systems have emerged as a popular source of alternative energy. However, numerous deficiencies exist in current mounting devices and methods of installation. Striking a balance between customizability and efficiency of installation is paramount to the design and implementation of a successful photo voltaic system.

While many available photovoltaic systems are highly customizable, they lack in efficiency. Current installation methods, commonly referred to as build-on-site, require multiple steps taking place over several days of construction. First, workers must attach mounting devices to the surface or underlying substructure. Each additional mounting device requires penetration of the roof surface with a lag bolt, which compromises the roof's weather resistant barrier. Measurements are then taken and framing members are cut to length and mounted. Next, workers must measure, cut and install large amounts of wiring and component connections. Finally, photovoltaic modules are added individually until a completed photovoltaic array is formed. Each photovoltaic module must also be secured to the framework by additional mounting hardware. In many methods, this requires the added steps of inserting, positioning and tightening several nuts, bolts and washers per panel. Furthermore, addition of an aftermarket panel cleaning system results in added labor costs and risks possible damage to the installed photovoltaic panels.

In addition, the on-site installation of electrical wiring and power conversion elements creates unsafe working conditions for installers. When conventional string inverters are used as part of the system, the photovoltaic panels must be electrically connected in series as they are installed resulting in live, high-voltage, DC current on the roof The use of string inverters also requires that extreme measures be taken to insure that all elements of the framing system are securely grounded. The installers must work around this live power to install additional strings of panels and their associated components. The large array of tools and components that must be loaded onto the sloped roof surface and controlled during installation makes build-on-site construction a complex and hazardous process.

Once installed, photovoltaic arrays are subjected to varying climates and must be able to withstand high winds and snow accumulation. Current systems, such as the one described above, are entirely dependent on the underlying roof surface to maintain their form. Additional mounting points can marginally increase the stability and load capacity of these build-on-site systems, but require additional penetrations to the roof surface. One of the major disadvantages to build on-site construction is that framing members exist as independent components rather than as an integrated framework. During installation the framing members are secured directly to the mounting devices without the added benefit of stabilizing cross members. Each row of photovoltaic panels is therefore mechanically independent from the adjacent rows. Because of this, many roof surface mounting points are required and there is no system wide load sharing. The inability to create an integrated framework makes build-on-site systems inefficient for carrying high wind and snow loads.

The increased demand for solar systems brings with it a need for a safer and more efficient means of producing and deploying them. Therefore, a need exists in the industry for a new and useful integrated, multi-module, photovoltaic mounting system capable of off-site prefabrication, transportation and installation as a unitized assembly.

BRIEF SUMMARY OF THE INVENTION

The present disclosure is directed to an apparatus and method for fixing photovoltaic modules within a unitized photovoltaic assembly and installing on a roof or other surface. Central to the unitized photovoltaic assembly is a unitary frame support structure. The unitary frame is formed from horizontal rails and vertical struts positioned in uniform rows and columns respectively. The unitary frame is discussed herein in the context of being installed on a sloping residential roof In this context, the term "horizontal" used in connection with the rails means that each rail extends laterally along the sloping roof without a substantial change in inclination along its length, and the term "vertical" used in connection with the struts means that each strut is inclined along its length so that one end of the strut is vertically higher than the other end. The rails are solidly affixed to the struts by welding or other means. Each rail is a uniform structure having a double "I" cross-section and receiving slots. Opposing edges of the photovoltaic panels are retained within these receiving slots. Retaining brackets and spacer clips are provided for maintaining the photovoltaic panels within the receiving slots. Unlike existing systems, the unitized photovoltaic assembly is not solely dependent on the support of the underlying surface to maintain its form. As a result, less mounting hardware is required to obtain a rigid structure, which reduces the number of roof surface penetrations and installation time. This has the added benefit of reducing damage to the roof surface caused by workers walking on it.

Installation is further streamlined with the inclusion of additional elements during the off-site fabrication process. Power conversion elements are affixed to the unitary frame and pre-wired to the photovoltaic panels. The wiring includes polarized connector elements at the terminal ends allowing adjacent unitized photovoltaic assemblies to be easily connected to one another. Also, a spray head is installed for cleaning the photovoltaic panels and tubing is connected for carrying cleaning fluids. By pre-assembling these systems, workers will no longer be subjected to hazardous conditions while maneuvering tools, materials and themselves around live wires on a sloped roof surface.

The unitized photovoltaic assembly is designed to integrate with adjacent assemblies to form a completed array. Various assembly configurations are possible including, but not limited to, IX2, IX3, 2X2 and 2X3 depending on the size and shape of the installation surface. Adjacent assemblies are structurally joined with mounting interlocks adding to the rigidity and load carrying capacity of the completed system. Mounting interlocks are attached to the end of a strut or rail and engage with corresponding mounting interlocks on adjacent assemblies. Electrical wiring and tubing are also connected between adjacent assemblies to complete the system.

In order to form a completed system, each unitized photo voltaic assembly is installed from above with the use of a specialized lifting frame. Since larger unitized photo voltaic assemblies are not sufficiently rigid to stand alone, the lifting frame provides additional support to prevent the assembly from flexing and causing damage to the photo voltaic panels. Use of the specialized lifting frame in conjunction with a crane alleviates the need for photovoltaic panels to be individually carried up a ladder to the roof surface. The lifting frame includes a plurality of tabs and in some instances a "U" channel, which engage and stabilize the horizontal rails of the unitary frame. Cables attached to the lifting frame are adjustable to match the slope of the roof surface. Once positioned, the unitized photovoltaic assembly is lowered onto the roof surface and secured to conventional mounting devices that have been pre-installed on the roof or other surface. The type of mounting devices will vary depending on the installation surface.

The foregoing is intended to provide a broad description of the present invention in order to demonstrate its contributions to the art and better understand the descriptions to follow. These and other features of the present invention will be readily apparent to persons of ordinary skill in the art upon reading the entirety of this disclosure.

DETAILED DESCRIPTION OF THE INVENTION

The present disclosure describes an apparatus for mounting photovoltaic modules, herein referred to as a unitized photovoltaic assembly 100. The preferred embodiment as shown in FIGS. 1 through 11, comprises a unitary frame 110 constructed to retain multiple photovoltaic modules 102 and various other elements. The unitized photovoltaic assembly 100 is designed for off-site fabrication, and can be transported and installed as a single unit, thereby reducing the time and resources required for build on-site construction.

Figure 1:
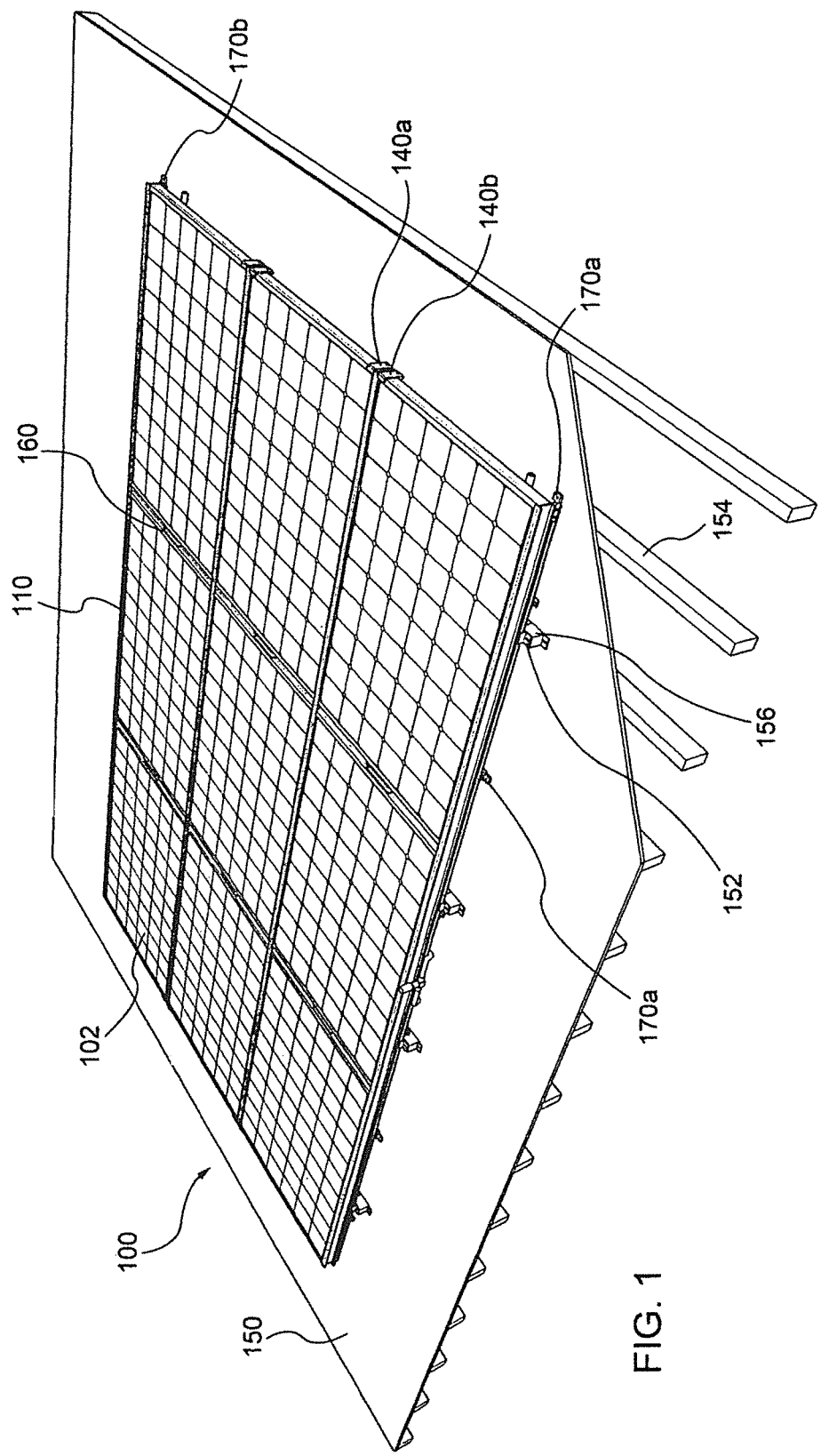
FIG. 1 is a perspective view of a unitized photovoltaic assembly 100 according to the present invention.

In the preferred embodiment of unitized photo voltaic assembly 100, shown in FIG. 1, a unitary frame 110 provides the structural framework for the mounting of various elements. As shown, nine photovoltaic modules 102 are arranged into three rows defined by unitary frame 110. Alternatively, unitary frame 110 can be adjusted to accommodate more or less photovoltaic modules 102, depending on the application requirements. The Photovoltaic modules 102 are maintained within unitary frame 110 by a plurality of retaining brackets 140a, b at the ends of each row in addition to spacers 160 between adjacent photovoltaic modules 102.

The unitized photovoltaic assembly 100 is secured to a surface 150 with repositionable mounting brackets 152. More specifically, mounting brackets 152 are attached to the unitary frame 110 and bolted to mounting devices 156. The mounting devices 156 are preinstalled to the surface 150 in accordance with local building codes. In the present embodiment, mounting devices 156 are bolted to rafters 154. Various types of mounting devices 156, common within the industry, may be utilized. In some instances, mounting devices 156 may not be necessary, in which case mounting brackets 152 can be secured directly to the surface 150.

Also shown in FIG. 1, are mounting interlocks 170a, b. Mounting interlocks 170a, b are secured to the unitary frame 110 and are used to mechanically interconnect adjacent unitized photovoltaic assemblies 100 to form a complete system. Because of mounting interlocks 170a, b, various arrangements of unitized photovoltaic assemblies 100 can be created, which have the added benefit of increased load sharing across the completed system.

Figure 2:
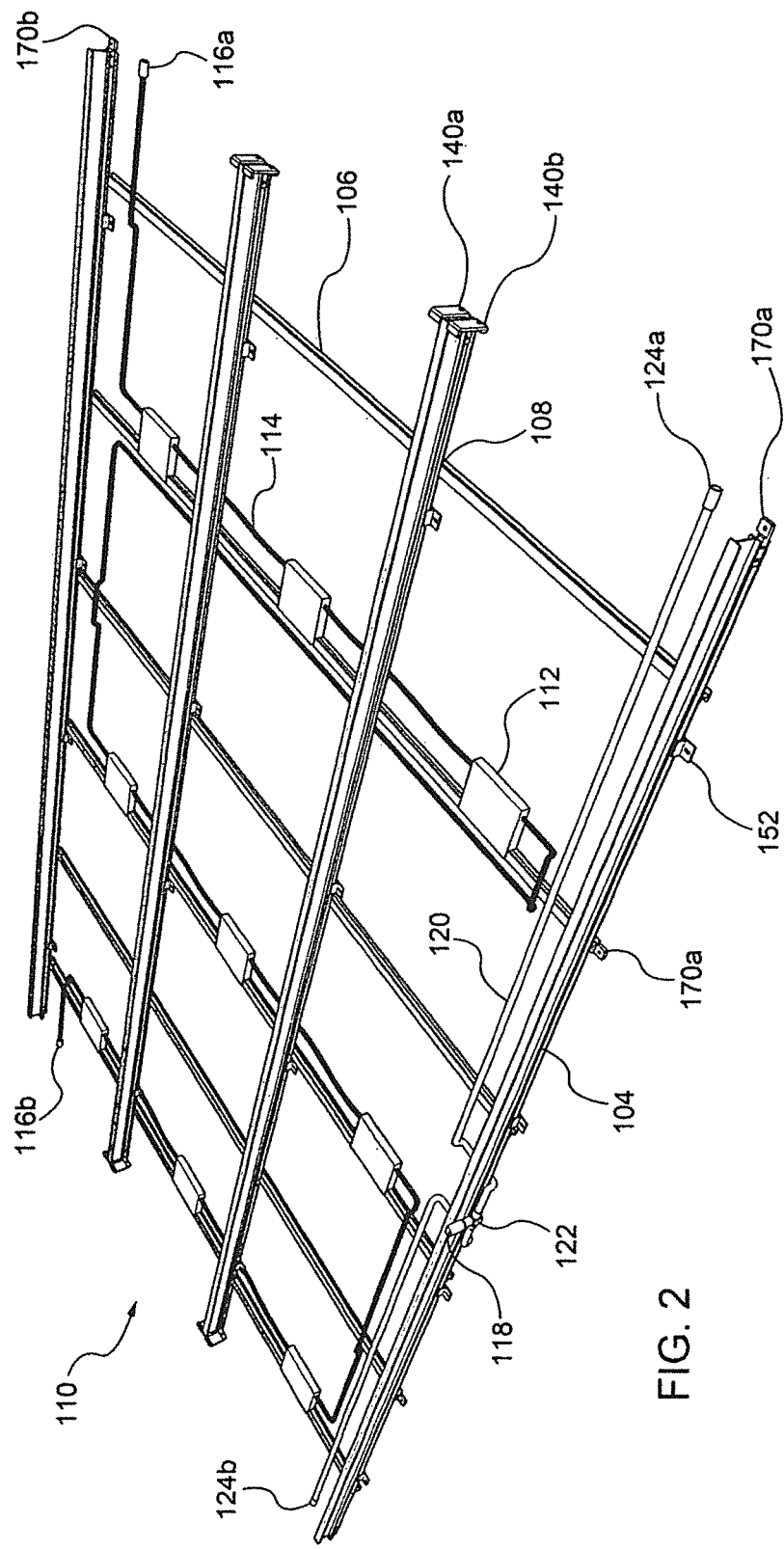
FIG. 2 is a perspective view of unitary frame 110 according to the present invention.

FIG. 2 shows unitary frame 110 in further detail, without photovoltaic modules 102. The unitary frame 110 is comprised of a plurality of rails 104 mounted above and welded to a plurality of struts 106 at cross points 108. Brackets or fasteners could also be used in place of welding to mount rails 104 to struts 106. Fabrication in this manner creates a unified framework central to the formation of the unitized photo voltaic assembly 100. In the preferred embodiment, additional elements are attached to unitary frame 110 prior to installation. Additional elements may include, but are not limited to, power conversion elements 112, spray head 118, wiring 114, tubing 120, retaining brackets 140a, b, mounting interlocks 170a, b and mounting brackets 152.

In the preferred embodiment, power conversion elements 112 are micro-inverters, which are attached to unitary frame 110 beneath photovoltaic modules 102. The micro-inverters convert power from unregulated direct current (DC) to alternating current (AC) or to regulated DC depending on the installation requirements. Each power conversion element 112 is electrically connected to a corresponding photovoltaic module 102. Individual power conversion elements 112 are also connected to one another by wiring 114. Wiring 114 is generally attached to unitary frame 110 and terminates at the perimeter of unitized photovoltaic assembly 100 with polarized power connectors 116a, b. Polarized power connector 116a can be connected to 116b of an adjacent unitized photovoltaic assembly 100 permitting a plurality of unitized photovoltaic assemblies 100 to aggregate their power by providing feed in and feed out paths for electrical power and control signals. The polarized power connectors 116a, b can also be connected to a power collection unit when unitized photovoltaic assembly 100 is an original or terminal assembly. In this manner, minimal effort is required to wire the completed system.

The preferred embodiment also includes at least one assembly spray head 118 attached to unitary frame 110. Spray head 118 directs cleaning fluids into a spray pattern covering photovoltaic modules 102. Spray head 118 is connected to tubing 120 by a "T" spray connector 122. In an alternate embodiment, when spray head 118 is the final sprayer, spray connector 122 is an elbow instead of a "T". Tubing 120 supplies alternately, clear and soapy water from a pressure source (not shown). Tubing 120 is also generally attached to the unitary frame 110 and terminates at the perimeter of unitized photovoltaic assembly 100 with fluid connectors 124a, b. Fluid connectors 124a, b allow cleaning fluid to flow to and from adjacent unitized photovoltaic assemblies 100.

The addition of elements to the unitary frame 110 in this manner provides for a plug-and-play unitized photovoltaic assembly 100. This system allows for additional unitized photovoltaic assemblies 100 to be added with minimal connections and little or no additional wiring or tubing. Also, pre-wiring and the use of low-voltage power conversion elements 112 eliminates hazardous live wiring on the roof surface 150 creating a safer working environment.

Figure 3:
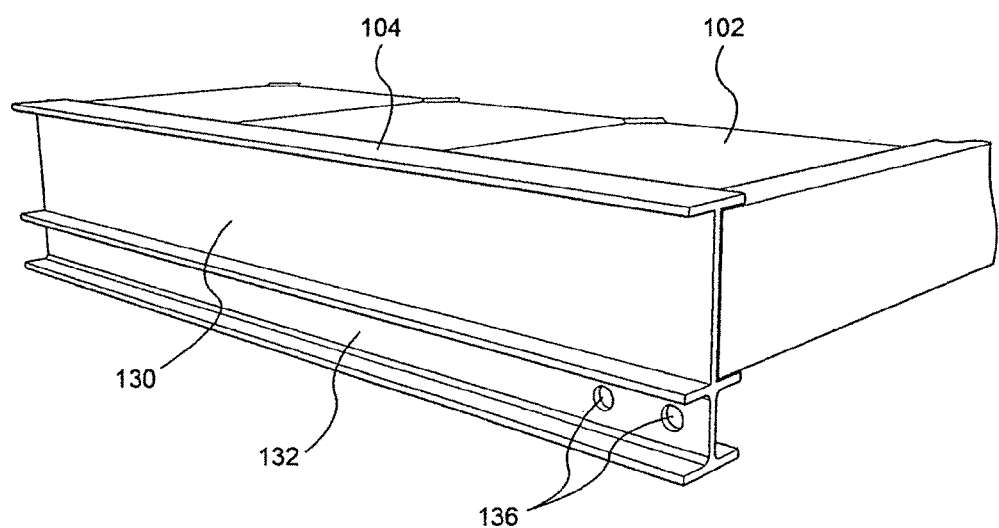
FIG. 3 is a perspective view of horizontal rails 104 according to the present invention.

As referred to above, the main structural components of unitary frame 110 are rails 104 and struts 106. FIG. 3 illustrates the uniform structural cross-section of rails 104. An extrusion process forms rails 104 with a uniform double "I" cross section designed to resist flexure. In the preferred embodiment, rails 104 are made from aluminum alloy, but other material having similar strength to weight properties could also be used. The structure of rails 104 provides U-shaped receiving slots 130 for retaining photovoltaic modules 102. In the preferred embodiment, rails 104 are oriented laterally and substantially parallel to one another. When arranged in this manner, photovoltaic modules 102 can be slideably retained by their opposing edges within slots 130. In the illustrated embodiment the slots 130 present smooth support surfaces upon which photovoltaic module edges can slide. The retained opposing edges of photovoltaic modules 102 can be either the long or short edges. Accordingly, the length and arrangement of rails 104 are determined by the dimensions, orientation and number of photovoltaic modules 102 to be retained. Additionally, rails 104 provide U-shaped receiving slots 132 for accepting mounting interlocks 170a,b and retaining brackets 140a, b. Rails 104 also include holes 136 for the securing of mounting interlocks 170a, b and retaining brackets 140a, b.

Figure 4A:
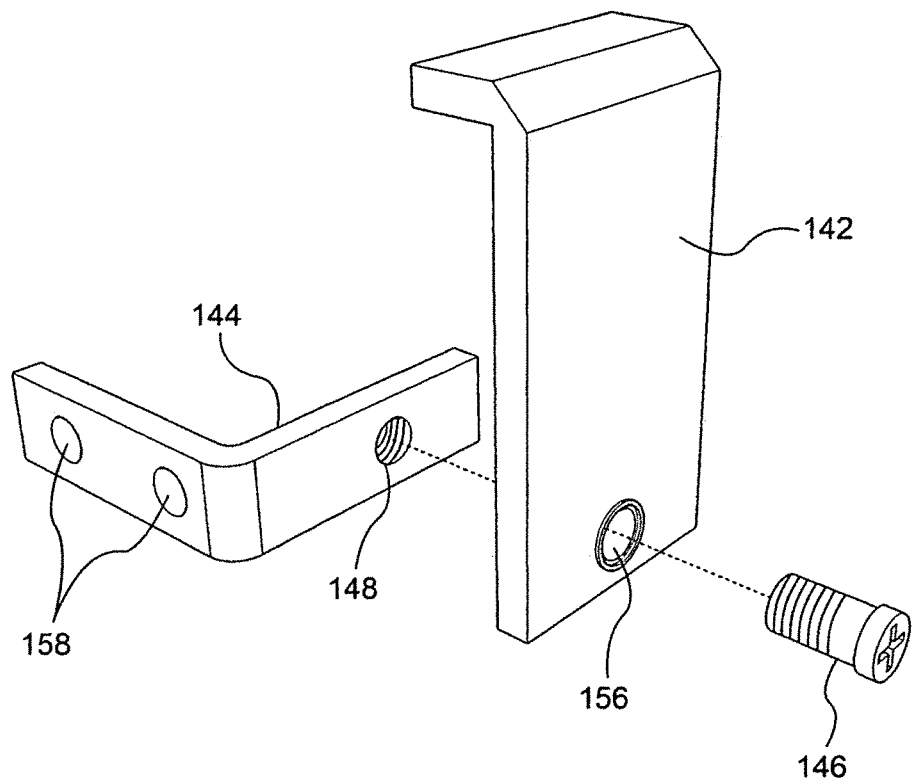
FIG. 4A is an exploded view of retaining bracket 140a according to the present invention.
Figure 4B:
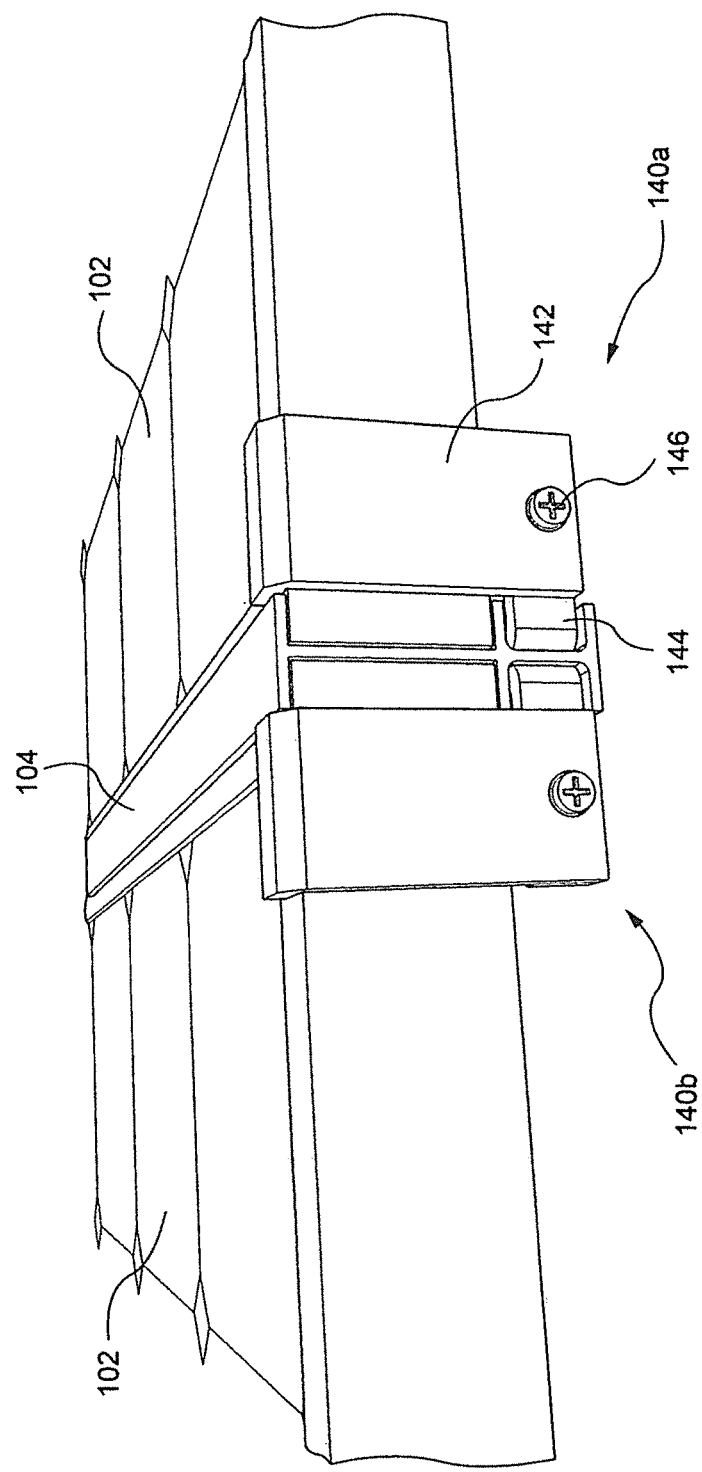
FIG. 4B is a perspective view of retaining brackets 140a, b according to the present invention.

FIGS. 4A and 4B more closely illustrate retaining brackets 140a, b, shown generally in FIG. 1. Retaining brackets 140a, b, laterally retain photovoltaic modules 102 within slots 130. In the present embodiment, individual retaining bracket assemblies 140a,b comprise a retaining element 142 that engages the outer edge of the end most photovoltaic modules 102 in each row so as to block the photovoltaic modules from sliding out of the unitary frame 110. Retaining element 144 is attached to an L bracket 144 by fastener 146. L bracket 144 includes a threaded hole 148 for receiving fastener 146. Removal of fastener 146 allows retaining element 142 to be disengaged from photovoltaic module 102. This will allow partial or complete removal of photovoltaic modules 102 from unitary frame 110. Furthermore, L bracket 144 is affixed to the ends of rails 104 within receiving slots 132. Specifically, L bracket 144 includes holes 158, which align with holes 136 on rails 104. A bolt or other fastener engages holes 158 and holes 136 to secure L bracket 144 to rails 104. The main deference between retaining brackets 140a and 140b is the orientation of L bracket 144, depending on which side of rail 104 it is positioned.

Additionally, during installation of unitized photovoltaic assembly 100 it may be helpful to disengage the retaining element 142 and slide photovoltaic modules 102 partially out of the unitary frame 110 in order to gain access to mounting brackets 152 or to additional elements of the system described above. As shown in FIGS. 3 and 5B, the surfaces of the U-shaped receiving slot 130 in each rail 104 are flat and smooth, as are surfaces of the edges of the photovoltaic module 102, thus enabling the photovoltaic modules 102 to slide relative to the unitary frame 110.

Figure 5A:
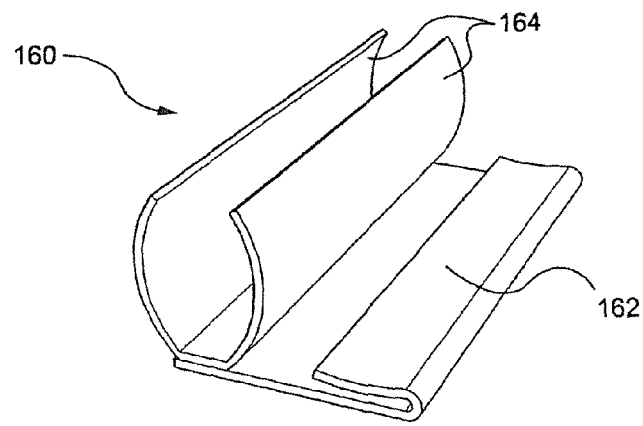
FIG. 5A is an isolated view of spacer 160 according to the present invention.
Figure 5B:
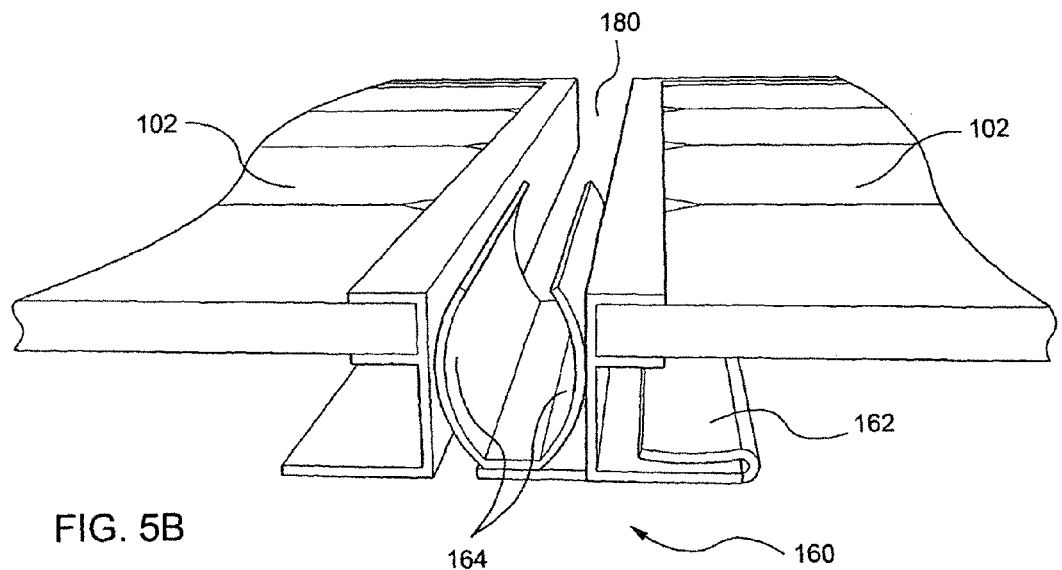
FIG. 5B is a cross-sectional view of spacer 160 according to the present invention.

FIGS. 5A and 5B show spacer 160. Spacer 160 comprises a clip 162, which attaches to photovoltaic modules 102. Spacer 160 includes fins 164. Fins 164 contact the edges of adjacent photovoltaic modules 102 thereby maintaining a gap 180. Gap 180 is useful for allowing the expansion and contraction of photovoltaic modules 102 during temperature changes. Spacer 160 is sufficiently resilient to allow such expansion and contraction of the photovoltaic modules 102. Additionally, gap 180 provides a space for lifting frame 190 to engage unitary frame 110, discussed below.

Figure 6:
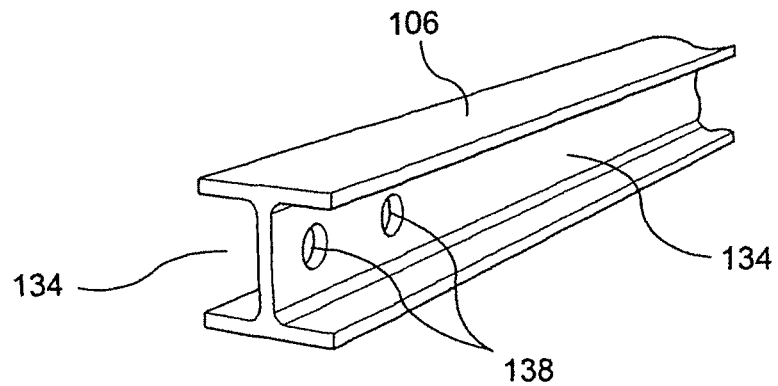
FIG. 6 is a perspective view of struts 106 according to the present invention.

FIG. 6 shows the uniform structural cross-section of struts 106, shown generally in FIG. 2. An extrusion process forms struts 106 with an "I" cross-section designed to resist flexure. Struts 106 are preferably made from aluminum alloy, but other material having similar strength to weight properties could also be used. The design of struts 106 provides U-shaped receiving slots 134 for accepting interlock elements 170. Struts 106 also provide mounting surfaces for additional elements attached to unitary frame 110, discussed above. In the present embodiment, struts 106 are oriented generally in the vertical direction to align with the roofs underlying rafters 154. It is important to note that struts 106 must not be aligned with gaps 180 as this will prevent lifting frame 190 from engaging with unitary frame 110.

Figure 7A:
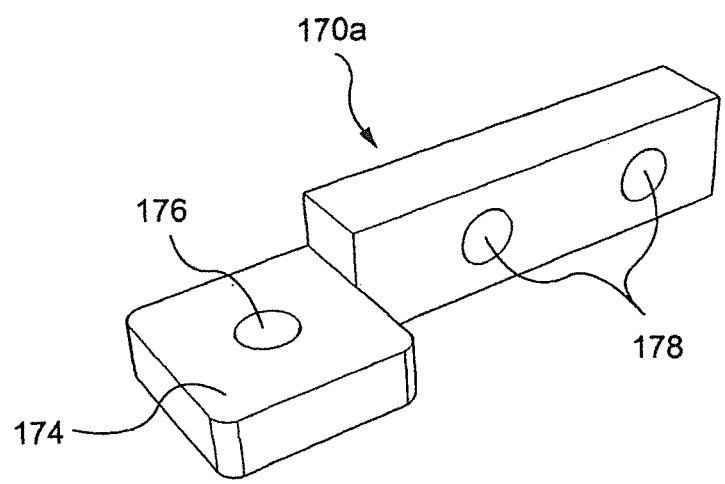
FIG. 7A is an isolated view of mounting interlock 170a according to the present invention.
Figure 7B:
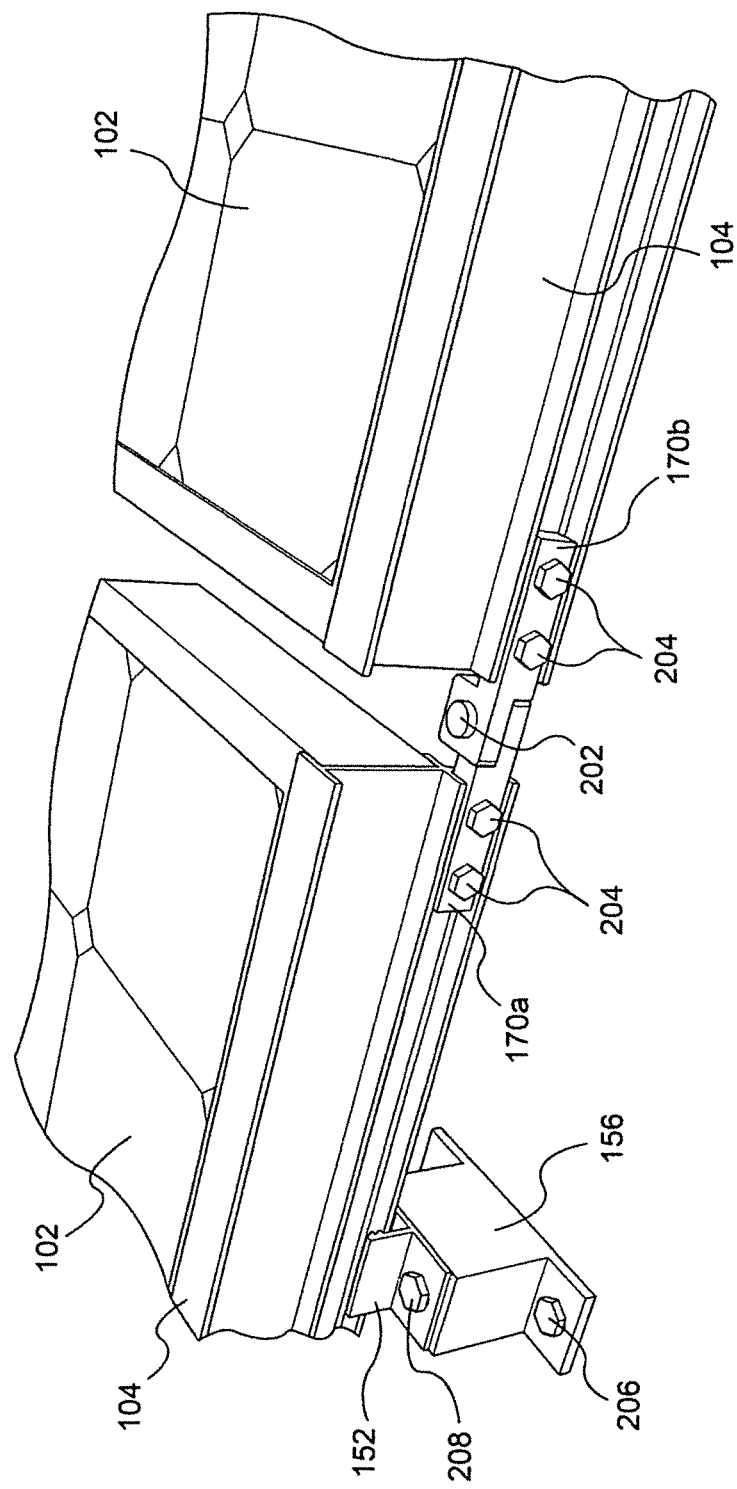
FIG. 7B is a perspective view of mounting interlocks 170a,b according to the present invention.

The preferred embodiment includes interlocks 170a, b, shown in FIGS. 7A and 7B, in order to maintain a mechanical relationship between adjacent unitized photovoltaic assemblies 100, thereby contributing to the structural integrity and load sharing capacity of the completed system. Interlocks 170a, b are attached to the ends of rails 104 and struts 106 within receiving slots 132 and 134, respectively. Mounting interlocks 170a,b include holes 178, which align with holes 136 or 138 depending on whether they are mounted to rails 104 or struts 106. As shown in FIG. 7A, interlocks 170 also provide a ledge 174. Ledge 174 is positioned face up or face down in order to engage a corresponding adjacent ledge 174. The interaction between adjacent interlocks 170a,b is more clearly demonstrated in FIG. 7B. Interlocks 170a, b also include a locking hole 176 to accept a fastener 202, thereby mechanically joining adjacent unitized photovoltaic assemblies 100. Mounting interlocks 170a and 170b are mirrored so that corresponding locking holes 176 will align during the joining of unitized photovoltaic assemblies 100.

Also shown in FIG. 7B, are mounting brackets 152 for securing unitized photovoltaic assembly 100 to a surface. Mounting brackets 152 are attached to rails 104 or struts 106 of the unitary frame 110. During installation, mounting brackets 152 are secured to standard mounting devices 156 using bolts 208. Prior to installation of the unitized photovoltaic assembly 100, mounting devices 156, are installed to the surface 150 and secured with lag bolts 206 to underlying rafters 154. FIG. 1 more broadly illustrates the use of mounting brackets 152 for securing unitary frame 110 to a surface 150. In some instances, mounting devices 156 may not be required, in which case mounting brackets 152 can be directly attached to surface 150 or underlying rafters 154, depending on the local building code.

Figure 8:
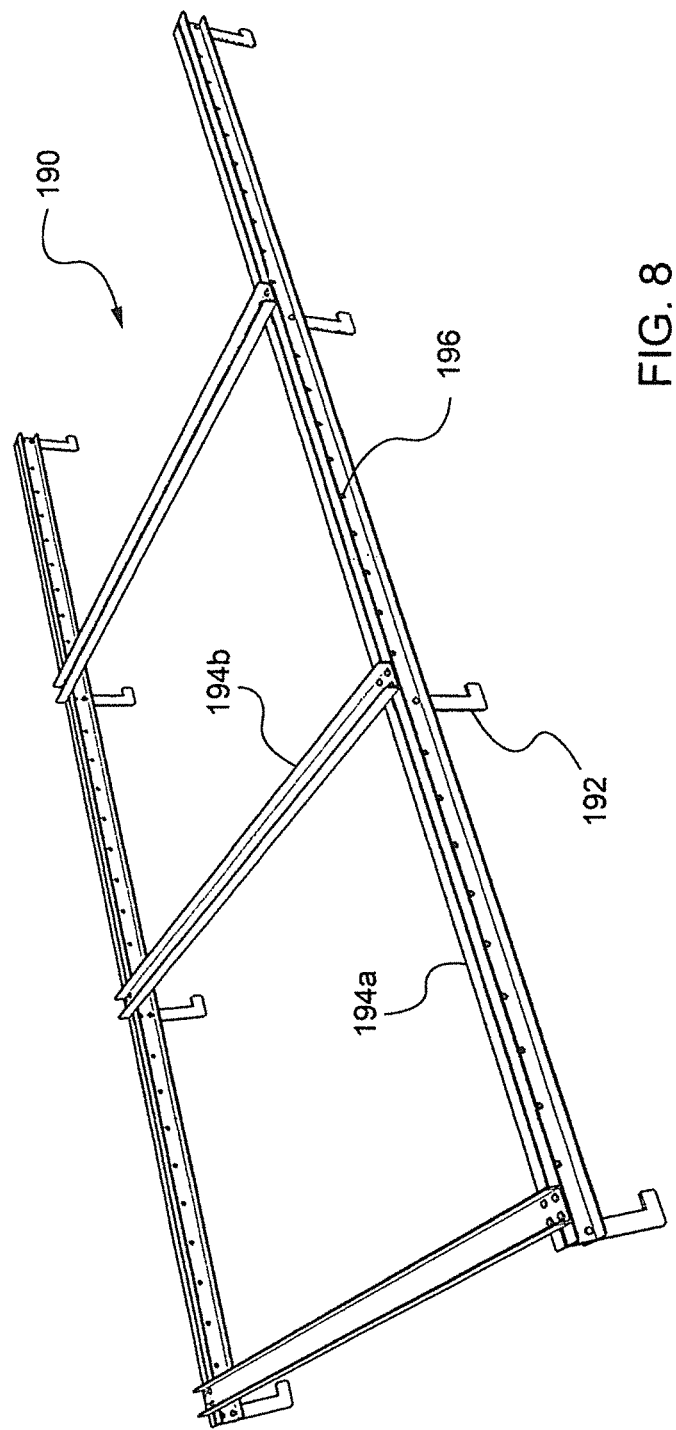
FIG. 8 is a perspective view of lifting frame 190 according to the present disclosure.
Figure 9:
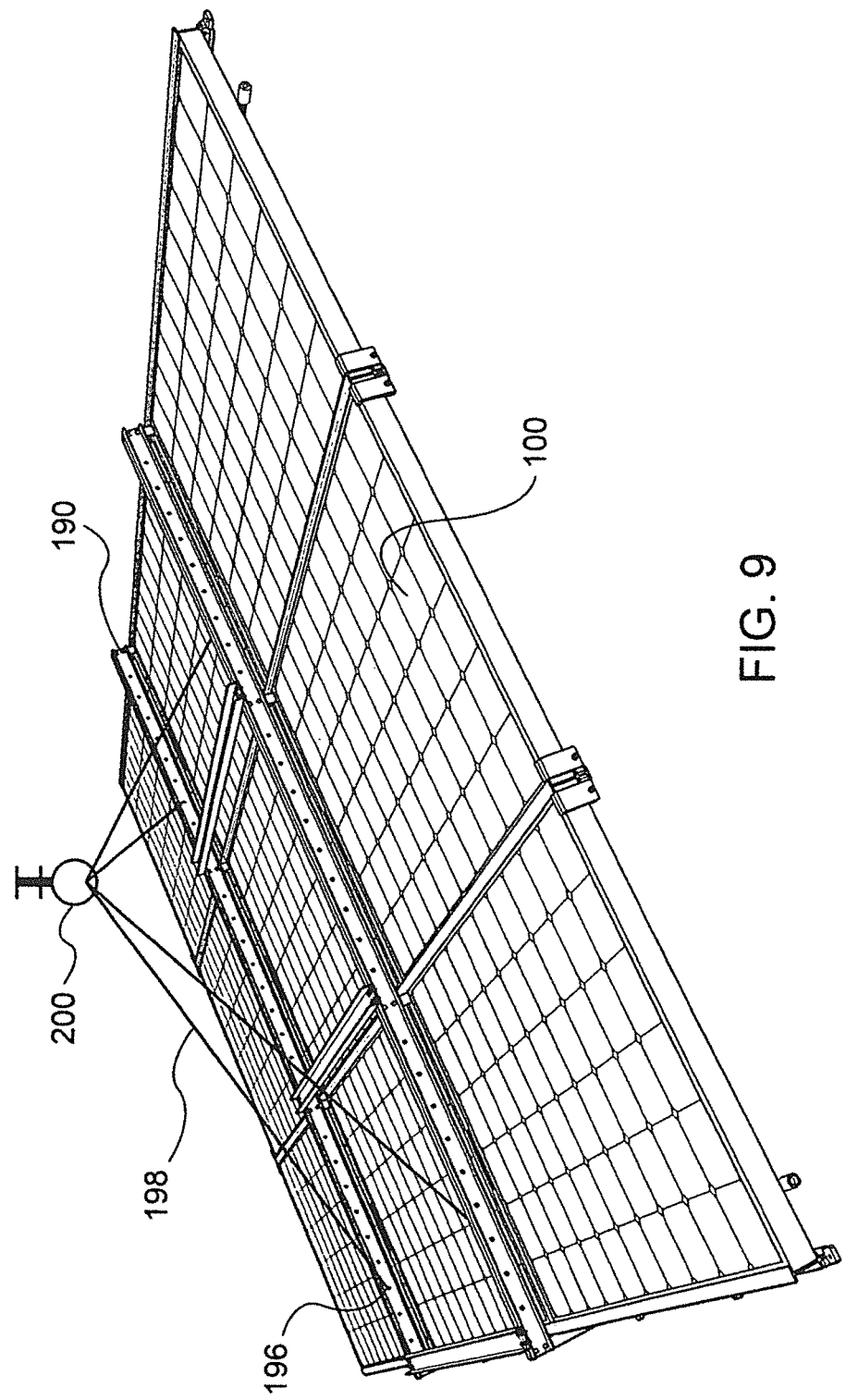
FIG. 9 is a perspective view of lifting frame 190 engaged with a unitized photovoltaic array 100 according to the present invention.
Figure 10:
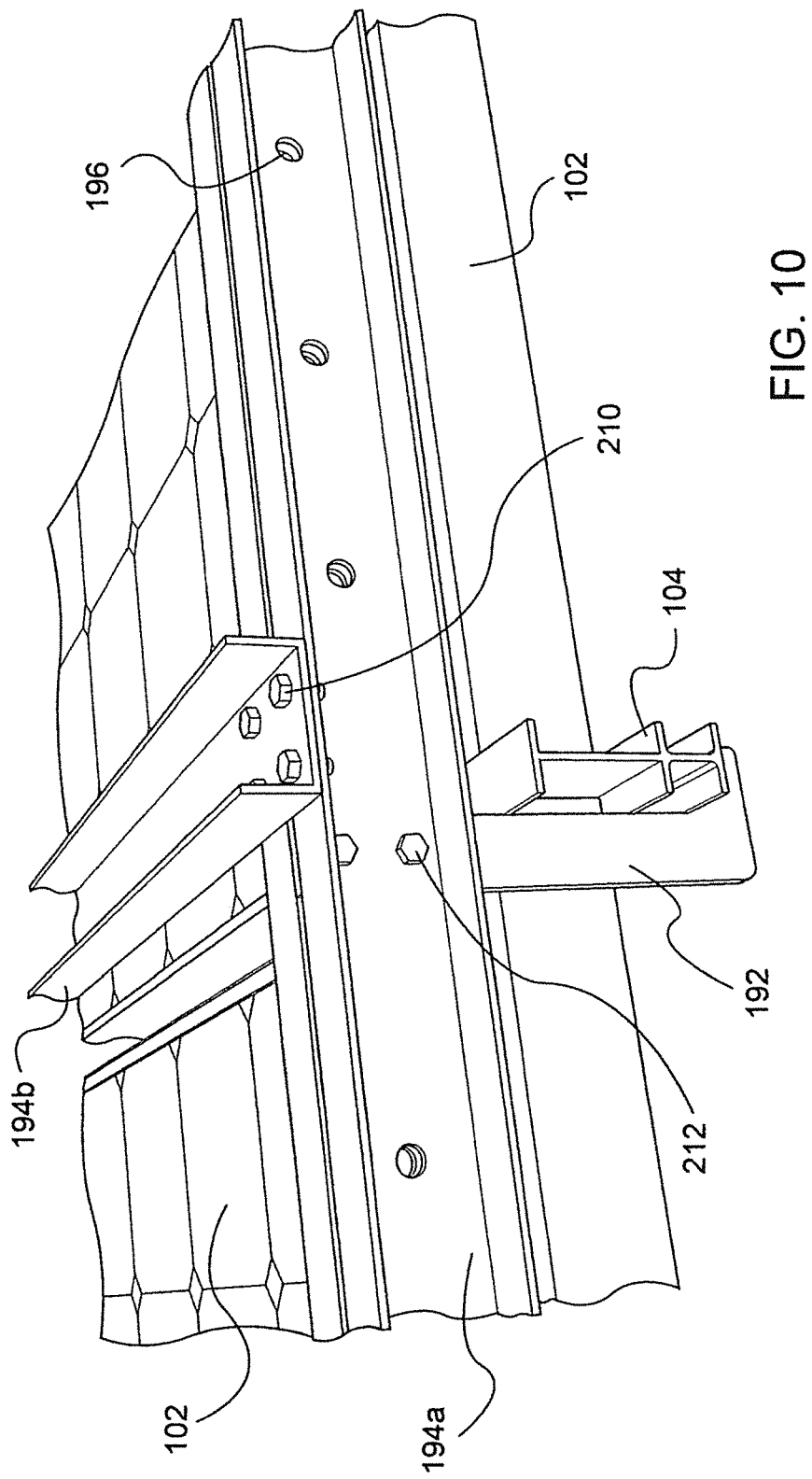
FIG. 10 is a cross-sectional view of lifting frame 190 engaged with a unitized photovoltaic array 100 according to the present invention.

FIGS. 8, 9 and 10 relate to the structure and use of lifting frame 190. Unitary frame 110 is designed to maintain the general structure of unitized photovoltaic assembly 100, but it is not significantly rigid to support photovoltaic modules 102 independently. Merging lifting frame 190 with unitized photovoltaic assembly 100 provides the necessary rigidity to inhibit bending of unitary frame 100 and thereby prevents damage to photovoltaic modules 102 during installation.

Lifting frame 190 comprises a framework having a plurality of tabs 192 and rail supports 194a, b for engaging unitary frame 110. More specifically, tabs 192 pass through gaps 180 to engage corresponding horizontal rails 104. Vertical rail supports 194a are comprised of two "C" channels oriented back to back with tabs 192 positioned between them. Tabs 192 are secured to rail supports 194a with bolts 212, as shown in FIG. 10. Horizontal cross rail supports 194b, also "C" channels, are attached to the horizontal rail supports 194a with bolts 210. Bolts 210 and 212 are used to allow for lifting frame 190 to be adjusted for unitized photovoltaic assemblies 100 of varying sizes. For large assemblies 100 additional rail supports 194a can be added including additional tabs 192.

In the preferred embodiment, lifting frame 190 is connected to a crane hook 200 by cables 198 attached to holes 196, as shown in FIG. 9. The cables 198 can be attached to different holes 196 and repositioned in relation to the crane hook 200 to achieve varying angles in order to match the slope of the installation surface 150. After unitized photovoltaic assembly 100 is installed on the roof or other surface 150, lifting frame 190 is disengaged from unitized photovoltaic assembly 100 and re-used.

Although the present invention has been described in accordance with the embodiments shown and contains many specifics, these descriptions should not be construed as limiting the spirit of the invention or scope of the appended claims.

What is claimed is:

1. A method of installing a photovoltaic array, comprising:
lifting a prefabricated photovoltaic array as a unit onto an installation surface, the prefabricated photovoltaic array comprising a unitary frame retaining a plurality of photovoltaic modules; and
attaching the prefabricated photovoltaic array to the installation surface;
wherein attaching the prefabricated photovoltaic array to the installation surface comprises:
sliding one or more of the photovoltaic modules partially out of the unitary frame to gain access to a mount member of the unitary frame;
attaching the mount member to the installation surface; and
sliding the one or more of the photovoltaic modules back into the unitary frame.

2. A method as in claim 1, wherein the unitary frame comprises a retaining element that prevents the one or more of the photovoltaic modules from sliding out of the unitary frame, and additionally comprising disengaging the retaining element prior to sliding the one or more of the photovoltaic modules.

3. A method as in claim 2, wherein lifting the prefabricated photovoltaic array comprises engaging an adjustable lifting frame with the unitary frame and with a crane so that the lifting frame is interposed between the crane and photovoltaic array and supports the photovoltaic array, and adjusting the lifting frame so that the prefabricated photovoltaic array is supported at an angle that matches a slope of the installation surface.

4. A method as in claim 2 additionally comprising reengaging the retaining element after sliding the one or more of the photovoltaic modules back into the frame.

5. A method as in claim 4, wherein the photovoltaic modules have opposing side edges and opposing end edges, and the opposing side edges are slidably retained in elongate slots formed in the unitary frame.

6. A method as in claim 5, wherein the unitary frame comprises a plurality of elongate, spaced apart struts rigidly connected to first and second elongate, spaced apart rails that extend transverse to the struts, the elongate slots being formed in the rails so that a first row of one or more of the photovoltaic modules is suspended between the elongate slots of the first and second rails.

7. A method as in claim 6, wherein the retaining element extends into a space between the elongate slots of the first and second rails so as to abut one of the end edges of one of the one or more photovoltaic modules.

8. A method as in claim 6 wherein a third elongate rail is rigidly attached to the plurality of struts and is spaced from the second rail, and a second row of one or more of the photovoltaic modules is suspended between elongate slots of the second and third rails, and additionally comprising engaging a lifting frame with the unitary frame, wherein the lifting frame comprises a plurality of spaced apart rail supports rigidly attached to a plurality of cross rail supports, and a plurality of tabs attached to the rail supports, wherein engaging the lifting frame with the unitary frame comprises engaging tabs of the lifting frame with at least two of the elongate rails.

9. A method as in claim 8, wherein each row of the photovoltaic modules comprises at least two photovoltaic modules, and additionally comprising advancing one of the tabs through a gap between end edges of adjacent photovoltaic modules and into engagement with one of the rails.

10. A method as in claim 1 additionally comprising attaching a plurality of mounting devices to the installation surface prior to lifting the prefabricated photovoltaic array.

11. A method as in claim 10, wherein lifting the prefabricated photovoltaic array comprises aligning a plurality of mount members of the frame with a plurality of the mounting devices.

12. A method as in claim 1, wherein the prefabricated photovoltaic array comprises electrical componentry connected to the unitary frame and wired by electrical wiring to the photovoltaic modules.

13. A method as in claim 12, wherein the prefabricated photovoltaic array comprises a spray head and tubing connected to the unitary frame.

14. A method as in claim 12 additionally comprising providing the prefabricated photovoltaic array by fabricating the unitary frame, mounting the photovoltaic modules in the unitary frame, connecting the electrical componentry to the unitary frame and wiring the electrical componentry to the photovoltaic modules remotely from the installation surface, and additionally comprising transporting the prefabricated photovoltaic array as a unit to the installation surface.

15. A method as in claim 14, additionally comprising testing the electrical componentry before transporting the prefabricated photovoltaic array.

16. A method as in claim 12 additionally comprising lifting a second prefabricated photovoltaic array onto the installation surface, attaching the prefabricated photovoltaic array to the installation surface adjacent the first prefabricated photovoltaic array, attaching the unitary frames of the first and second photovoltaic arrays to one another via an interlock, and attaching electrical wiring of the first photovoltaic array to electrical wiring of the second photovoltaic array.

* * * * *